United States Patent
Wang et al.

(10) Patent No.: US 11,001,529 B2
(45) Date of Patent: May 11, 2021

(54) CRUCIBLE FOR CASTING NEAR-NET SHAPE (NNS) SILICON

(71) Applicant: Silfex, Inc., Eaton, OH (US)

(72) Inventors: Rong Wang, Springboro, OH (US); Haresh Siriwardane, Oakwood, OH (US); Igor Peidous, Liberty Township, OH (US); Vijay Nithianathan, Springboro, OH (US)

(73) Assignee: SILFEX, INC., Eaton, OH (US)

( * ) Notice: Subject to any disclaimer, the term of this patent is extended or adjusted under 35 U.S.C. 154(b) by 288 days.

(21) Appl. No.: 15/988,126

(22) Filed: May 24, 2018

(65) Prior Publication Data

US 2019/0359529 A1 Nov. 28, 2019

(51) Int. Cl.
*C30B 11/00* (2006.01)
*C04B 35/584* (2006.01)
*C01B 32/956* (2017.01)
*C04B 41/81* (2006.01)
(Continued)

(52) U.S. Cl.
CPC .......... *C04B 35/584* (2013.01); *C01B 32/956* (2017.08); *C04B 35/565* (2013.01);
(Continued)

(58) Field of Classification Search
CPC ..... C30B 11/00; C30B 11/002; C30B 11/003; C30B 29/00; C30B 29/02; C30B 29/06; C30B 35/00; C30B 35/002; Y10T 117/00; Y10T 117/10; Y10T 117/1024; Y10T 117/1092; C04B 35/565; C04B 35/584; C04B 35/653; C04B 41/81; C01B 32/956; F27B 14/00; F27B 14/08; F27B 14/10; F27B 2014/102
(Continued)

(56) References Cited

U.S. PATENT DOCUMENTS 3,141,400 A * 7/1964 Powers .................... A21B 3/13
249/82
5,443,111 A 8/1995 Colvin et al.
(Continued)

FOREIGN PATENT DOCUMENTS

| CN | 105312513 A | 2/2016 |
| EP | 0530825 A1 | 3/1993 |
| JP | 11-240710 A * | 9/1999 |
| JP | H11240710 A | 9/1999 |

(Continued)

OTHER PUBLICATIONS

International Search Report and Written Opinion for Application No. PCT/US2019/032674 dated Aug. 30, 2019.

*Primary Examiner* — Kenneth A Bratland, Jr.

(57) ABSTRACT

A crucible includes an outer element and an inner element. The outer element includes a first portion that is horizontal at a bottom end of the crucible and a second portion that ascends radially outwardly from the bottom end of the crucible to a top end of the crucible at a first acute angle to a vertical axis. The inner element includes a conus with a cylinder at a base of the conus. The conus descends radially outwardly from the top end of the crucible to the bottom end of the crucible at a second acute angle to the vertical axis. The inner element includes a base portion of the cylinder attached to the first portion of the outer element using a sealant to form a hollow mold between an inner portion of the outer element and an outer portion of the inner element.

9 Claims, 10 Drawing Sheets

(51) Int. Cl.
  *C04B 35/653* (2006.01)
  *C04B 35/565* (2006.01)
  *C30B 35/00* (2006.01)

(52) U.S. Cl.
  CPC ............ *C04B 35/653* (2013.01); *C04B 41/81* (2013.01); *C30B 11/002* (2013.01); *C30B 35/002* (2013.01)

(58) Field of Classification Search
  USPC ....... 117/11, 73, 81, 83, 200, 206, 223, 928, 117/931
  See application file for complete search history.

(56) References Cited

U.S. PATENT DOCUMENTS

| | | | |
|---|---|---|---|
| 6,237,671 | B1 | 5/2001 | Lassow et al. |
| 6,676,381 | B2 | 1/2004 | Subramanian et al. |
| 2005/0241569 | A1* | 11/2005 | Oyama ................... C30B 11/00 117/73 |
| 2007/0028835 | A1* | 2/2007 | Yamauchi ........... F27D 99/0006 117/206 |
| 2009/0208400 | A1* | 8/2009 | Julsrud ................ C30B 11/002 423/348 |
| 2010/0197070 | A1* | 8/2010 | Stoddard ................ C30B 11/02 438/68 |

FOREIGN PATENT DOCUMENTS

| | | | |
|---|---|---|---|
| JP | 2003188143 A | * | 7/2003 |
| KR | 1019840004375 A | | 10/1984 |

\* cited by examiner

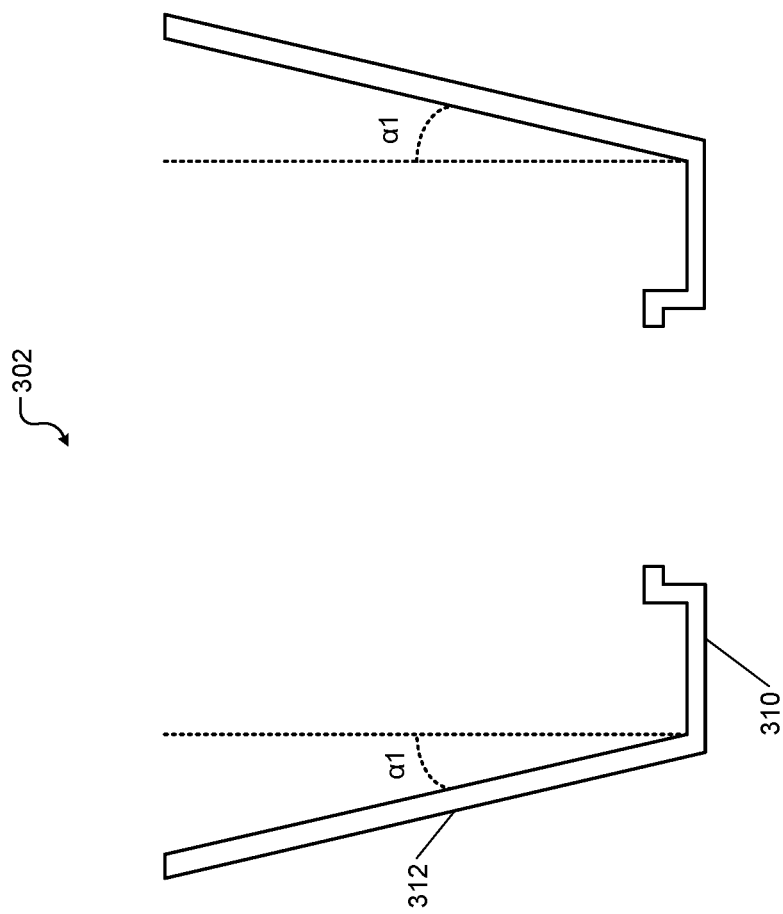

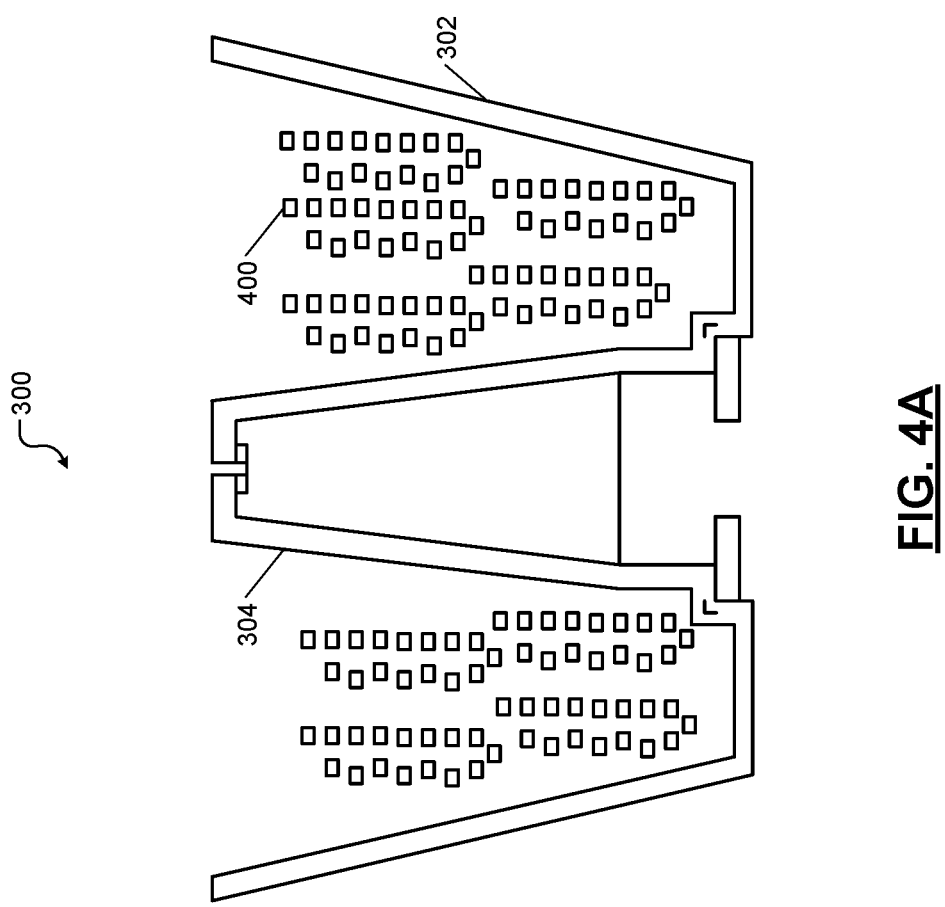

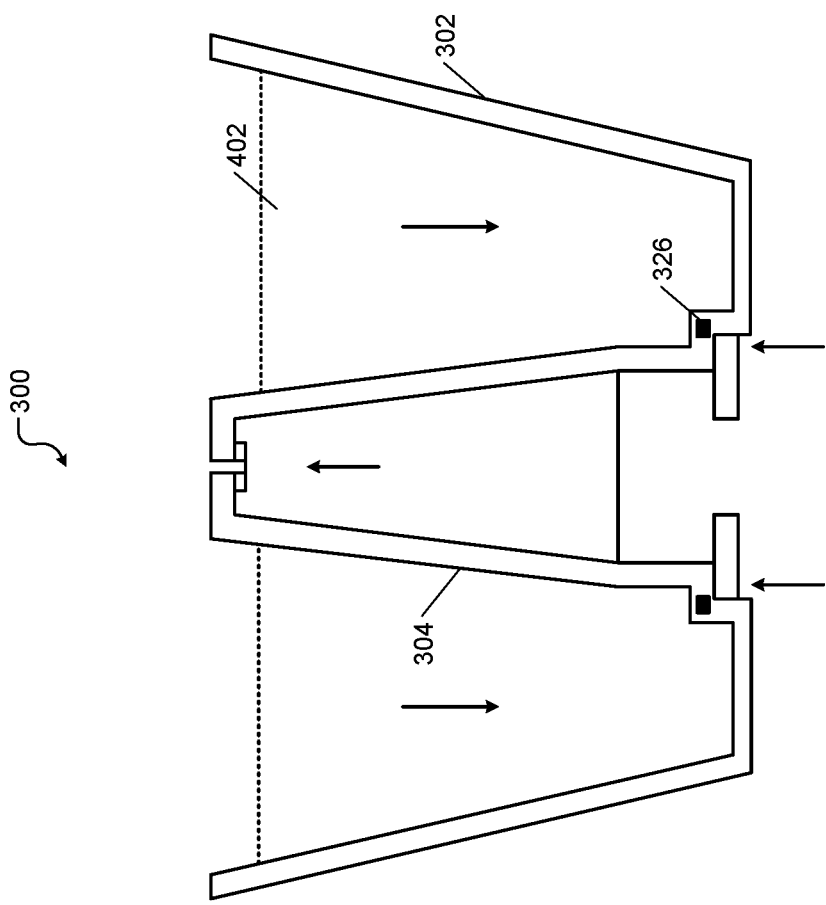

CRUCIBLE FOR CASTING NEAR-NET SHAPE (NNS) SILICON

FIELD

The present disclosure relates generally to casting ingots and more particularly to crucibles for casting near-net shape (NNS) silicon ingots.

BACKGROUND

The background description provided here is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

Critical chambers parts of capital equipment for processing semiconductor wafers and manufacturing semiconductor devices are fabricated using multi-crystalline silicon material. Most chamber parts have the shape of rings and circular plates. Square quartz crucibles are used to cast multi-crystalline silicon (Mc-Si). Producing final chamber parts from squared Mc-Si ingots requires several additional processing steps. These standard methods used to make chamber parts are costly due to the multiple process steps, the time involved in processing, and the material wasted during shaping.

SUMMARY

A crucible for forming an ingot comprises a hollow mold with an inner conical wall and an outer conical wall. The hollow mold is configured to receive a solid material comprising silicon, silicon carbide, or a non-oxide ceramic that is melted and cooled to form the ingot. The inner conical wall of the hollow mold descends radially outwardly at an acute angle to a vertical axis from a top end of the hollow mold to a bottom end of the hollow mold. The outer conical wall of the hollow mold ascends radially outwardly at the acute angle to the vertical axis from the bottom end of the hollow mold to the top end of the hollow mold. The acute angle prevents the ingot from cracking.

In other features, the acute angle is greater than zero and less than or equal to 15 degrees.

In other features, the inner conical wall and the outer conical wall are made of quartz; and an inner portion of the outer conical wall and an outer portion of the inner conical wall are coated with silicon nitride.

In other features, the ingot is 600 mm long.

In other features, the solid material further comprises a dopant.

In other features, the crucible further comprises at least one heater arranged around the outer conical wall to heat pieces of the solid material loaded in the hollow mold between the inner conical wall and the outer conical wall of the hollow mold. The crucible further comprises a cooling apparatus arranged near the bottom end of the hollow mold to cool a melted liquid formed in the hollow mold between the inner conical wall and the outer conical wall of the hollow mold by heating the pieces of the solid material. The crucible further comprises at least one temperature sensor associated with the hollow mold to sense a temperature of contents of the hollow mold. The crucible further comprises a controller to control the at least one heater and the cooling apparatus based on the sensed temperature to form the ingot from the melted liquid in the hollow mold.

In still other features, a crucible comprises an outer element and an inner element. The outer element includes a first portion that is horizontal at a bottom end of the crucible and a second portion that ascends radially outwardly from the bottom end of the crucible to a top end of the crucible at a first acute angle to a vertical axis. The inner element includes a conus with a cylinder at a base of the conus. The conus descends radially outwardly from the top end of the crucible to the bottom end of the crucible at a second acute angle to the vertical axis. The inner element includes a base portion of the cylinder attached to the first portion of the outer element using a sealant to form a hollow mold between an inner portion of the outer element and an outer portion of the inner element.

In other features, the hollow mold is configured to receive a solid material comprising silicon, silicon carbide, or a non-oxide ceramic that is melted and cooled to form an ingot.

In other features, the sealant comprises a mixture of silicon nitride and a liquid that is baked to form a seal between the outer element and the inner element.

In other features, the inner element is configured to separate from the outer element when a force is applied to the inner element in a downward direction from the top end of the crucible after an ingot is formed in the hollow mold to release the ingot without cracking the ingot.

In other features, the crucible further comprises a rod attached to a top end of the inner element to push the inner element downward from the top end of the crucible to disengage the inner element from the outer element after an ingot is formed in the hollow mold by melting a solid material in the hollow mold and by cooling the melted material in the hollow mold.

In other features, the rod is made of graphite or molybdenum.

In other features, the inner element and the outer element are made of quartz; and the inner portion of the outer element and the outer portion of the inner element are coated with silicon nitride.

In other features, the ingot is 600 mm long.

In other features, the solid material includes a dopant.

In other features, the crucible further comprises at least one heater arranged around the outer element to heat pieces of a solid material loaded in the hollow mold. The solid material includes silicon, silicon carbide, or a non-oxide ceramic. The crucible further comprises a cooling apparatus arranged near the bottom end of the hollow mold to cool a melted liquid formed in the hollow mold by heating the pieces of the solid material. The crucible further comprises at least one temperature sensor associated with the hollow mold to sense a temperature of contents of the hollow mold. The crucible further comprises a controller to control the at least one heater and the cooling apparatus based on the sensed temperature to form an ingot from the melted liquid in the hollow mold.

In still other features, a method for forming an ingot comprises forming a hollow mold having an inner conical wall and an outer conical wall. The inner conical wall descends radially outwardly at an acute angle to a vertical axis from a top end of the hollow mold to a bottom end of the hollow mold. The outer conical wall ascends radially outwardly at the acute angle to the vertical axis from the bottom end of the hollow mold to the top end of the hollow mold. The method further comprises receiving, in the hollow mold, a solid material comprising silicon, silicon carbide, or a non-oxide ceramic. The method further comprises melting the solid material in the hollow mold. The method further comprises cooling the melted material in the hollow mold to form the ingot. The acute angle prevents the ingot from cracking.

In other features, the acute angle is greater than zero and less than or equal to 15 degrees.

In other features, the method further comprises forming the inner conical wall and the outer conical wall from quartz; and coating an inner portion of the outer conical wall and an outer portion of the inner conical wall with silicon nitride.

In other features, the method further comprises forming the ingot that is 600 mm long.

In other features, the method further comprises adding a dopant to the solid material.

In other features, the method further comprises heating around the outer conical wall to melt pieces of the solid material loaded in the hollow mold between the inner conical wall and the outer conical wall of the hollow mold. The method further comprises cooling, from the bottom end of the hollow mold, a melted liquid formed in the hollow mold between the inner conical wall and the outer conical wall of the hollow mold by heating the pieces of the solid material. The method further comprises sensing a temperature of contents of the hollow mold. The method further comprises controlling the heating and the cooling based on the sensed temperature to form the ingot from the melted liquid in the hollow mold.

In still other features, a method of forming a crucible to form an ingot comprises forming an outer element with a first portion that is horizontal at a bottom end of the crucible and a second portion that ascends radially outwardly from the bottom end of the crucible to a top end of the crucible at a first acute angle to a vertical axis. The method further comprises forming an inner element including a conus with a cylinder at a base of the conus. The conus descending radially outwardly from the top end of the crucible to the bottom end of the crucible at a second acute angle to the vertical axis. The method further comprises forming the inner element including a base portion of the cylinder attached to the first portion of the outer element using a sealant to form a hollow mold between an inner portion of the outer element and an outer portion of the inner element.

In other features, the method further comprises receiving, in the hollow mold, a solid material comprising silicon, silicon carbide, or a non-oxide ceramic. The method further comprises melting the solid material in the hollow mold. The method further comprises cooling the melted material in the hollow mold to form an ingot.

In other features, the method further comprises forming the sealant by forming a mixture of silicon nitride and a liquid; and baking the mixture to form a seal between the outer element and the inner element.

In other features, the method further comprises applying a force to the inner element in a downward direction from the top end of the crucible after an ingot is formed in the hollow mold to separate the inner element from the outer element to release the ingot without cracking the ingot.

In other features, the method further comprises attaching a rod to a top end of the inner element to push the inner element downward from the top end of the crucible to disengage the inner element from the outer element after an ingot is formed in the hollow mold by melting a solid material in the hollow mold and by cooling the melted material in the hollow mold.

In other features, the method further comprises forming the rod from graphite or molybdenum.

In other features, the method further comprises forming the inner element and the outer element from quartz; and coating the inner portion of the outer element and the outer portion of the inner element with silicon nitride.

In other features, the method further comprises forming the ingot that is 600 mm long.

In other features, the method further comprises adding a dopant to the solid material.

In other features, the method further comprises heating around the outer element to melt pieces of a solid material loaded in the hollow mold where the solid material includes silicon, silicon carbide, or a non-oxide ceramic. The method further comprises cooling, from the bottom end of the hollow mold, a melted liquid formed in the hollow mold. The method further comprises sensing a temperature of contents of the hollow mold. The method further comprises controlling the heating and the cooling based on the sensed temperature to form the ingot from the melted liquid in the hollow mold.

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings, wherein:

FIG. 3A shows a cross-section of an outer element of a third crucible;

FIGS. 4A and 4B show a cross-sectional view of the third crucible showing formation of a silicon ingot;

In the drawings, reference numbers may be reused to identify similar and/or identical elements.

DETAILED DESCRIPTION

Briefly, the present disclosure relates to crucibles that can be used in a grower or in a casting furnace to produce a solid silicon piece (ingot) that is closer to a desired shape of a final finished part for an equipment chamber for processing semiconductor wafers. Specifically, the present disclosure relates to a hollow crucible for growing an ingot of silicon, silicon carbide, or other non-oxide ceramics.

In one embodiment, the crucible is a hollow mold with an inner wall and an outer wall. The inner and the outer wall are not parallel to each other. The inner and the outer wall have a greater distance to each other at the top end than at the bottom end. When molten silicon crystallizes in the crucible, the ingot is pushed upwardly and can then be removed.

In another embodiment, the crucible comprises an inner element and an outer element. The inner element includes a conus with a cylinder at a lower end of the conus that fits into a bottom opening of the outer element. To demold the ingot, the inner element can be pushed and released downwardly. Once the inner element is removed, the ingot can be pushed upwardly and can then be removed. These and other aspects of the present disclosure are described below in detail.

The present disclosure is organized as follows. A first crucible for producing a hollow cylindrical ingot is described with reference to FIGS. 1A-1B. A second crucible for producing a hollow cylindrical ingot is described with reference to FIGS. 2A-2B. A third crucible with separate outer and inner elements for producing a hollow cylindrical ingot is described with reference to FIGS. 3A-3C. The production of the hollow cylindrical ingot using the third crucible is described with reference to FIGS. 4A-4B. The removal of the hollow cylindrical ingot from the third crucible by pushing the inner element out of the third crucible is described with reference to FIG. 4C. A method for constructing the third crucible and producing an ingot using the third crucible is described using FIG. 5. A furnace with heaters, sensors, and a controller for producing an ingot using the first, second, or third crucible is described with reference to FIG. 6. A method of operating the furnace is described with reference to FIG. 7.

Figure 1B:
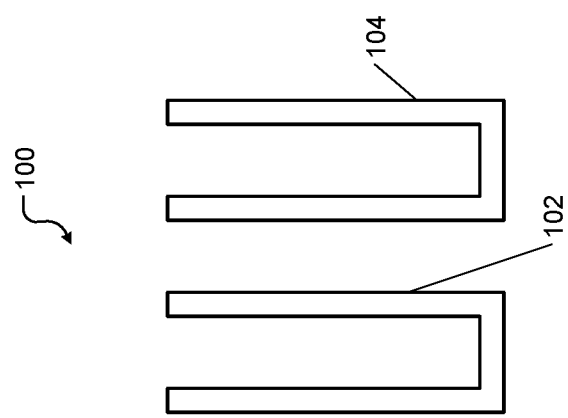
FIGS. 1A and 1B respectively show a plan view and a cross-section of a first crucible.
Figure 1A:
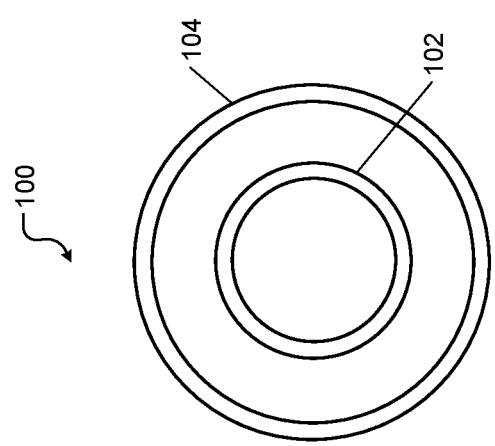

FIGS. 1A and 1B respectively show a plan view and a cross-section of a cylindrical crucible 100. A hollow cylindrical mold is formed between an inner wall 102 and an outer wall 104 of the cylindrical crucible 100. The inner and outer walls 102, 104 are joined at the bottom of the cylindrical crucible 100. Chunks of solid silicon (with or without a dopant) are loaded in the hollow mold. The cylindrical crucible 100 is placed in a furnace (see FIG. 6). The solid silicon is melted and cooled in the furnace to form a hollow cylindrical ingot.

When silicon transitions from melted phase to solid state, its volume increases. Accordingly, the solidifying silicon material exerts tensile forces on the outer walls 104. As a result, during solidification, outer walls 104 may crack. The following crucible designs prevent crucibles from cracking during solidification.

The melted silicon is cooled from the bottom of the cylindrical crucible 100, which causes solidification of the melted silicon from the bottom of the cylindrical crucible 100 in an upwardly direction. The cylindrical crucible 100 is generally made of quartz. The coefficient of thermal expansion (CTE) of quartz is one order of magnitude less than the CTE of silicon. During solidification, silicon can attach to quartz. To prevent silicon from attaching to quartz, an inner portion of the outer wall 104 and an outer portion of the inner wall 102 are coated with silicon nitride.

After solidification, the cooling silicon material contracts in the cylindrical crucible 100. The contraction of the cooling silicon is much greater compared to quartz. Therefore, silicon exerts compressive forces on the inner sides of the inner walls 102, and significant tensile stress develops in silicon. As a result, during cooling, silicon can crack starting from the inner sides of the inner walls 102. The following crucible designs prevent silicon from cracking during cooling.

Figure 2A:
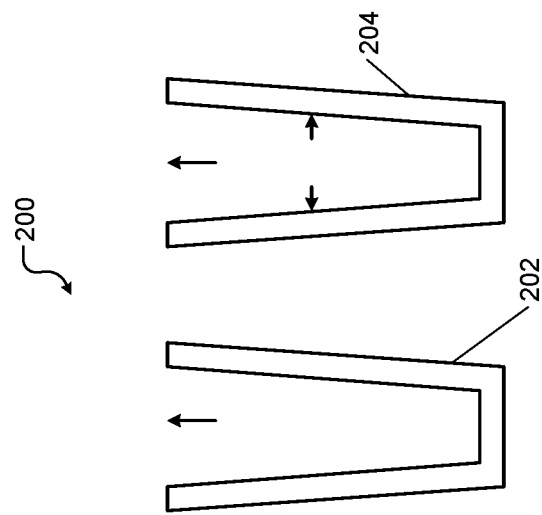
FIGS. 2A and 2B show a cross-section of a second crucible with a hollow mold having an inner conical wall and an outer conical wall.
Figure 2B:
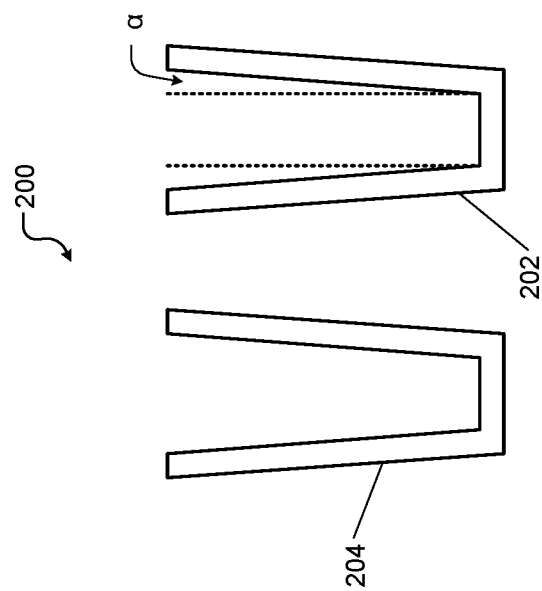

FIGS. 2A and 2B show a cross-section of a crucible 200 with a hollow mold having an inner conical wall 202 and an outer conical wall 204. The inner and outer conical walls 202, 204 are not parallel to each other. The inner and outer conical walls 202, 204 are separated by a greater distance at a top end of the hollow mold than at a bottom end of the hollow mold. The inner conical wall 202 descends radially outwardly at an acute angle α to a vertical axis from the top end of the hollow mold to the bottom end of the hollow mold. The outer conical wall 204 ascends radially outwardly at the acute angle α to the vertical axis from the bottom end of the hollow mold to the top end of the hollow mold.

The inclined inner and outer conical walls 202, 204 are joined at the bottom of the cylindrical crucible 200. Chunks of solid silicon (with or without a dopant) are loaded in the hollow mold. The crucible 200 is placed in a furnace (see FIG. 6). The solid silicon is melted and cooled in the furnace to form a hollow ingot having the shape of the crucible 200.

The melted silicon is cooled from the bottom of the crucible 200, which causes solidification of the melted silicon from the bottom of the crucible 200 in an upwardly direction. The crucible 200 is generally made of quartz. During solidification, silicon can attach to quartz. To prevent silicon from attaching to quartz, an inner portion of the outer conical wall 204 and an outer portion of the inner conical wall 202 are coated with silicon nitride.

During solidification, the cooling silicon expands upwards in the crucible 200. The expansion of the cooling silicon exerts forces on the inner sides of the inner and outer conical walls 202, 204 in the directions shown by side arrows in FIG. 2B. The inclined inner and outer conical walls 202, 204 accommodate the forces exerted by the expanding silicon on the inner sides of the inclined and outer conical walls 202, 204 in the directions shown by side arrows in FIG. 2B, which prevents silicon from cracking.

The inclined inner and outer conical walls 202, 204 of the crucible 200 also facilitate easy release of the ingot after growth and/or casting in the direction shown by an up arrow in FIG. 2B. Unexpectedly, due to the inclined walls, the crucible 200 can produce ingots as long as 600 mm without defects, which is not possible using the cylindrical crucible 100 due to cracking problems. The cylindrical crucible 100 can produce ingots much shorter in length than 600 mm (only up to about 350 mm). It should be noted that 600 mm is only a non-limiting example.

The acute angle α at which the inner and outer conical walls 202, 204 of the crucible 200 are inclined may be between 0 and 15 degrees, for example, to prevent silicon from cracking and to produce ingots nearly 600 mm long without defects. However, other values of the acute angle α greater than zero and less than 90 degrees are contemplated.

Figure 3B:
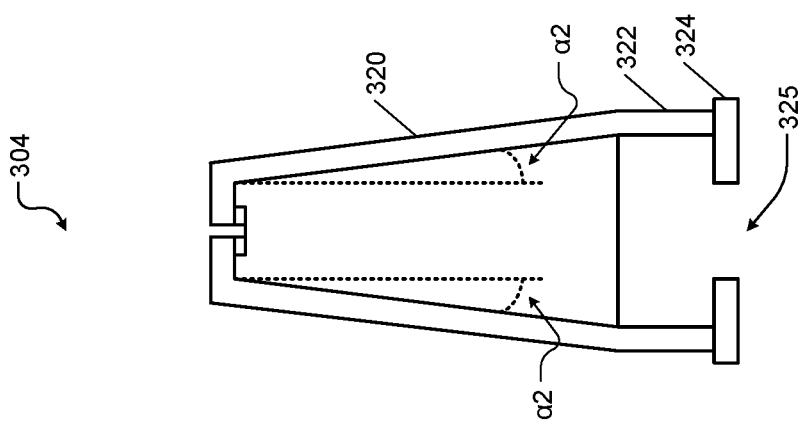
FIG. 3B shows a cross-section of an inner element of the third crucible.
Figure 3C:
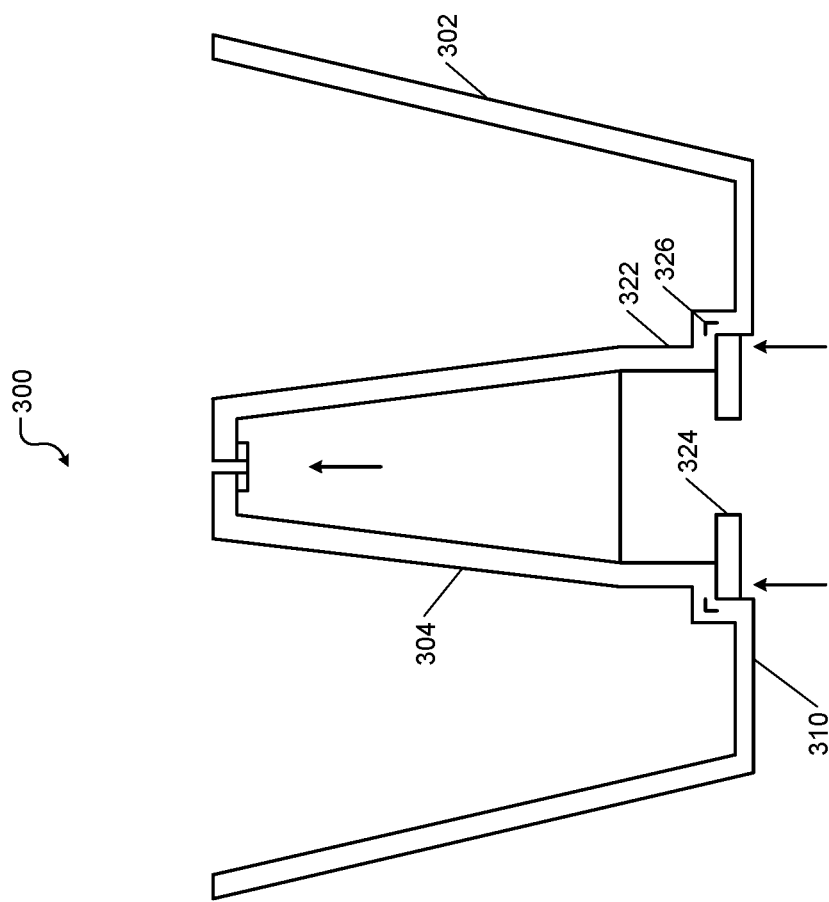
FIG. 3C shows a cross-section of the third crucible with a hollow mold formed by joining the outer and inner elements.

FIGS. 3A-3C show a cross-section of a crucible 300 with a hollow mold. The crucible comprises an outer element 302 shown in FIG. 3A and an inner element 304 shown in FIG. 3B. In FIG. 3C, the inner element 304 is joined to the outer element 302 to form the crucible 300.

In FIG. 3A, the outer element 302 comprises a first portion 310 and a second portion 312. The first portion 310 is horizontal at a bottom end of the crucible 300. The second portion 312 ascends radially outwardly from the bottom end of the crucible 300 to a top end of the crucible 300 at a first acute angle α1 to a vertical axis.

In FIG. 3B, the inner element 304 comprises a conus 320 with a cylinder 322 at a base of the conus 320. The conus 320 descends radially outwardly from the top end of the crucible 300 to the bottom end of the crucible 300 at a second acute angle α2 to the vertical axis. The cylinder 322 has a base portion 324. The inner element 304 comprising the conus 320, the cylinder 322, and the base portion 324 is not hollow. The base portion 324 has a large through-hole 325 at the center to manufacture the inner element 304.

In FIG. 3C, the crucible 300 is formed by joining the inner element 304 to the outer element 302 as follows. The base portion 324 of the cylinder 322 of the inner element 304 is attached to the first portion 310 of the outer element 302 using a sealant to form a hollow mold between an inner portion of the outer element 302 and an outer portion of the inner element 304 of the crucible 300.

The sealant comprises silicon nitride. Specifically, silicon nitride powder is mixed with a fluid (e.g., filtered water). The mixture is applied on areas where the base portion 324 of the cylinder 322 is joined to the first portion 310 of the outer element 302. The joint between the outer and inner elements 302, 304 (i.e., between the base portion 324 and the first portion 310) is baked to form a seal 326. The seal 326 prevents molten silicon from leaking through the joint.

Figure 4C:
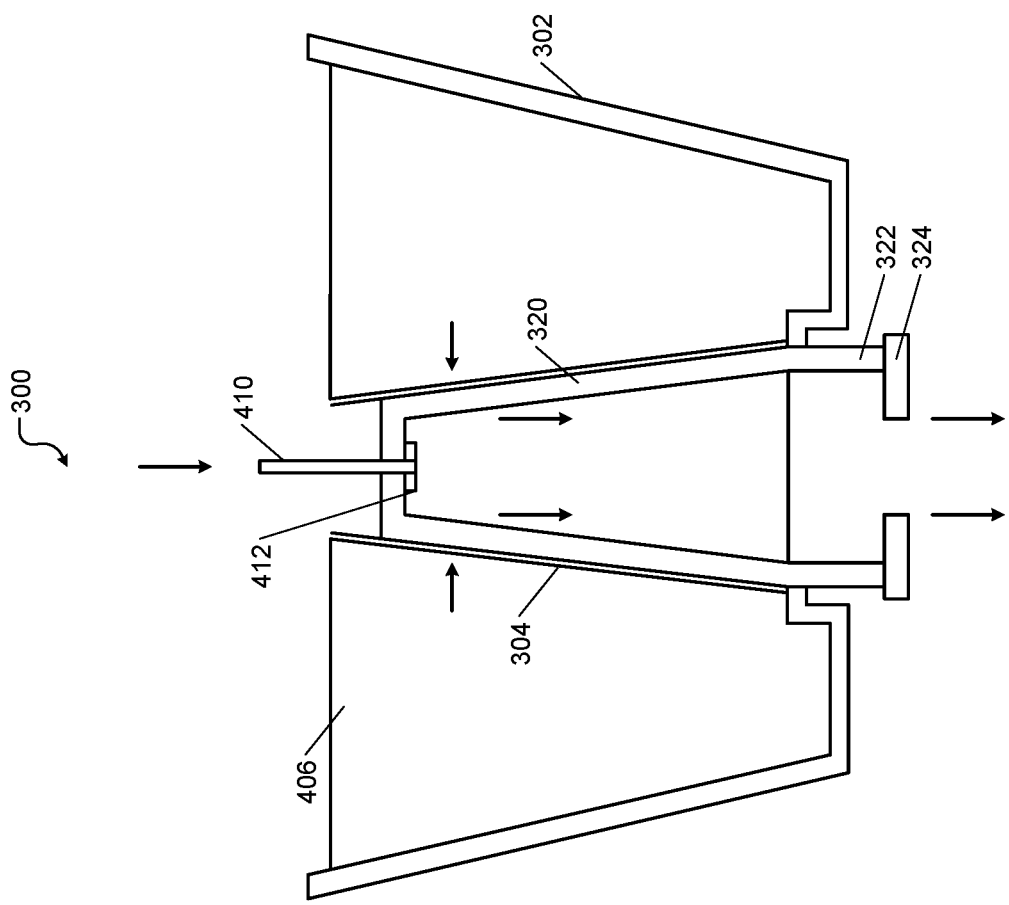
FIG. 4C shows a cross-sectional view of the third crucible showing removal of the inner element of the third crucible and release of the silicon ingot from the third crucible.

FIGS. 4A-4C show the formation a silicon ingot in the crucible 300 and the removal of the silicon ingot from the crucible 300. In FIG. 4A, chunks of solid silicon 400 (with or without a dopant) are loaded in the crucible 300. The crucible 300 is placed in a furnace (see FIG. 6). The solid silicon is melted and cooled in the furnace to form an ingot having the shape of the crucible 300.

In FIG. 4B, melted silicon 402 is cooled from the bottom of the crucible 300, which causes solidification of the melted silicon 402 from the bottom of the crucible 300 in an upwardly direction. The outer and inner elements 302, 304 of the crucible 300 are generally made of quartz. During solidification, silicon can attach to quartz. To prevent silicon from attaching to quartz, an inner portion of the outer element 302 and an outer portion of the inner element 304 are coated with silicon nitride.

In FIG. 4C, during solidification, the cooling silicon expands upwards in the crucible 300 to form an ingot 406. The expansion of the cooling silicon exerts forces on the inner sides of the outer and inner elements 302, 304 in the directions shown by side arrows. The inner element 304, particularly the conus 320, accommodates the forces exerted by the expanding silicon, which prevents silicon from cracking.

The inner element 304 also facilitates easy release of the ingot 406 after growth and/or casting. Specifically, the inner element 304 comprises a rod 410 attached to a top portion of the inner element 304 (at the top of the conus 320). The rod 410 is made of a material that can withstand the high temperatures of the molten silicon (e.g., about 1414 degrees Celsius). Additionally, the material does not contaminate the molten silicon. For example, the rod 410 is made of graphite or molybdenum.

When the ingot 406 is formed (i.e., after cooling), the rod 410 is pushed downwards. Pushing the rod 410 downwards exerts a force on the cylinder 322 at the base of the conus 320 of the inner element 304. Exerting the force on the cylinder 322 disengages the seal 326 between the outer and inner elements 302, 304 (i.e., between the base portion 324 of the cylinder 322 and the first portion 310 of the outer element 302). Disengaging the seal 326 releases the inner element 304 in the downwardly direction. Releasing the inner element 304 frees up the ingot 406 from the crucible 300. The ingot 406 is then pushed upwardly and removed from the crucible 300.

A base portion 412 of the rod 410 that attaches to the inner element 304 is disc shaped. The disc shaped base portion 412 of the rod 410 distributes the force applied to the rod 410 uniformly on the inner element 304 when the rod 410 is pushed downwards. Unexpectedly, due to the design and implementation of the inner element 304, the crucible 300 can produce ingots nearly 600 mm long without defects, which is not possible using the cylindrical crucible 100 due to cracking problems. The cylindrical crucible 100 can produce ingots only up to about 350 mm, which is much shorter in length than 600 mm.

Constructing the crucible 300 by joining the inner element 304 to the outer element 302 provides the following advantage. Although the inner walls of the outer and inner elements 302, 304 are coated with silicon nitride to prevent the silicon ingot from attaching to the inner walls, the silicon nitride coating may not be uniform throughout the inner walls. Accordingly, portions of the silicon nitride coating can crack at the high temperatures of the molten silicon, and silicon can attach to the quartz inner walls at locations where the silicon nitride coating cracks. The design and joining of the outer and inner elements 302, 304 using the sealant and the ability of the inner element 304 to disengage from the outer element 302 to release the ingot 406 prevent the ingot 406 from attaching to the inner walls of the outer and inner elements 302, 304 and render the ingot 406 defect-free.

When the ingot 406 is formed, any unwanted impurities present in the solid silicon 400 (other than any dopant intentionally added to the solid silicon 400) may accumulate near the top of the ingot 406. Accordingly, a small portion (e.g., about 5-10 mm) of the top of the ingot 406 containing the impurities is removed. The remainder of the ingot 406 is a defect-free component with a desired (near-net) shape that is ready to be cut into a plurality of rings for use in a processing chamber without further processing (e.g., grinding, polishing, reshaping, and so on). It should be noted that 5-10 mm is only a non-limiting example.

Figure 5:
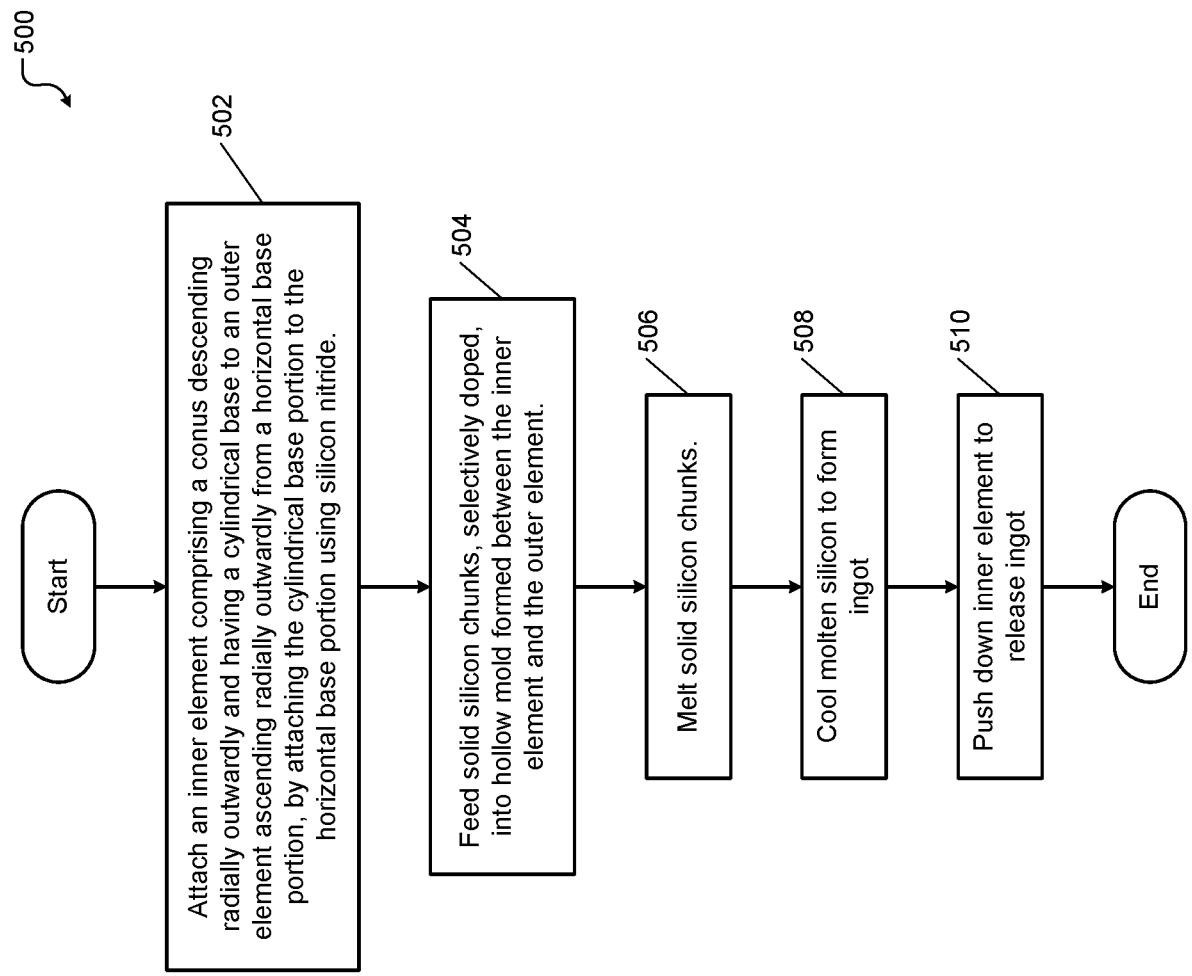
FIG. 5 shows a method of constructing the third crucible and forming the silicon ingot using the third crucible.

FIG. 5 shows a method 500 for constructing a crucible (e.g., the crucible 300) and producing an ingot (e.g., the ingot 406) according to the present disclosure. At 502, an inner element (e.g., the inner element 304) comprising a conus (e.g., the conus 320) descending radially outwardly and having a cylindrical base (e.g., the cylinder 322 with the base portion 324) is attached to an outer element (e.g., the outer element 302) ascending radially outwardly from a horizontal base portion (e.g., the first portion 310 of the outer element 302) to form a crucible (e.g., the crucible 300). The inner element is attached to the outer element by joining the cylindrical base of the inner element to the horizontal base portion of the outer element using a sealant (e.g., silicon nitride mixed with filtered water) that forms a seal (e.g., the seal 326) between the inner and outer elements of the crucible.

At 504, chunks of solid silicon, selectively doped, are loaded into a hollow mold formed between the inner and outer elements. At 506, the solid silicon is melted to form molten silicon. At 508, the molten silicon is cooled from the bottom of the crucible to form a silicon ingot (e.g., the ingot 406). At 510, the inner element is pushed downwardly using a rod attached to the top of the inner element. By pushing the rod downwardly, the inner element is disengaged from the outer element to release the silicon ingot from the crucible.

Figure 6:
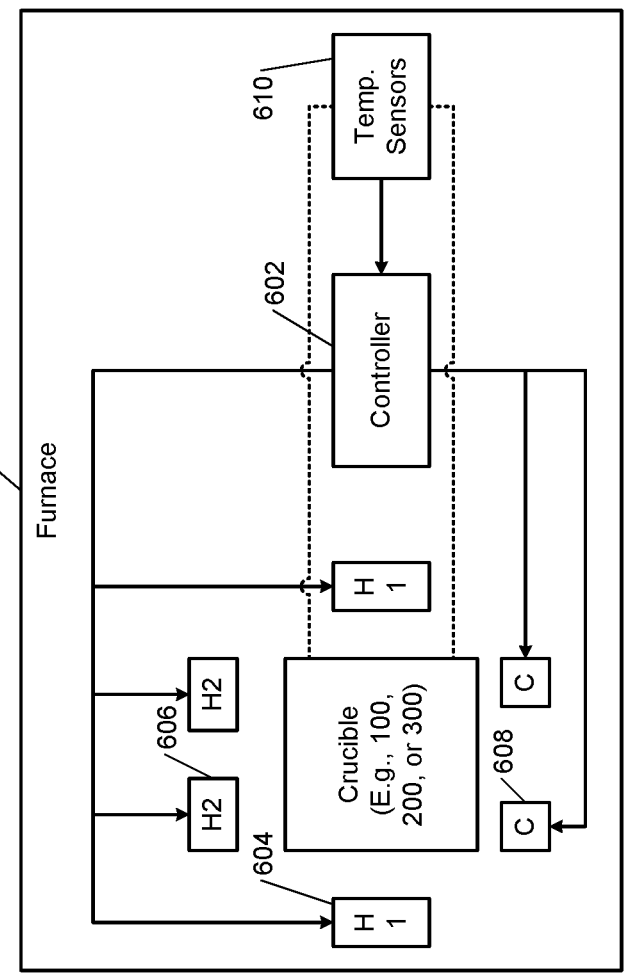
FIG. 6 shows a simplified block diagram of a furnace used to produce a silicon ingot by heating solid silicon and cooling molten silicon using the first, second, or third crucible.

FIG. 6 shows simplified schematic of a furnace 600. The furnace 600 comprises a controller 602, a plurality of heaters (e.g., a side heater H1 604 and a top heater H2 606), and a cooling assembly C 608 at the bottom of the furnace 600. A crucible (e.g., the crucible 100, 200, or 300) can be placed in the furnace 600.

The controller 602 controls the power supplied to the heaters 604, 606 to melt silicon in the crucible. The controller 602 controls the power supplied to the cooling assembly 608 to cool the molten silicon in the crucible.

The sensors 610 may be located in and around the crucible to sense the temperature of the silicon in the crucible as the silicon melts and as the molten silicon cools. The sensors 610 may be located elsewhere in the furnace (e.g., coupled and/or proximate to the heaters 604, 606 and the cooling assembly 608) to sense the power supplied to these elements and temperatures of these elements.

The controller 602 may communicate with the sensors 610 and receive data from the sensors 610. The controller 602 may control the power supplied to the heaters 604, 606 and to the cooling assembly 608 based on the data received from the sensors 610 to properly melt the silicon and to properly cool the molten silicon in the crucible, and to form a silicon ingot (e.g., the ingot 406).

Figure 7:
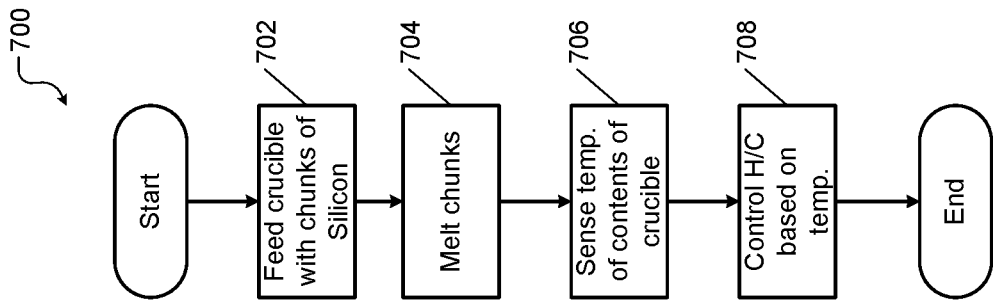
FIG. 7 shows a flow chart of a method of operating the furnace of FIG. 6.

FIG. 7 shows a method 700 for operating the furnace 600. The method 700 is executed by the controller 602. At 702, solid chunks of silicon, selectively doped, are loaded in a crucible (e.g., the crucible 100, 200, or 300). At 704, the solid chunks of silicon are melted by supplying power to a plurality of heaters (e.g., a side heater H1 604 and a top heater H2 606). At 706, the controller 602 receives data regarding the temperature of the silicon in the crucible from sensors (e.g., the sensors 610) located in and around the crucible. The controller 602 may also receive data about the power supplied to the heaters and the cooling assembly (e.g., the cooling assembly C 608) and about the temperatures of these elements. At 708, the controller 602 controls the power supplied to the heaters 604, 606 and the cooling assembly 608 based on the data received from the sensors 610 to properly melt the silicon, cool the molten silicon, and form the silicon ingot (e.g., the ingot 406).

The foregoing description is merely illustrative in nature and is not intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. It should be understood that one or more steps within a method may be executed in different order (or concurrently) without altering the principles of the present disclosure. Further, although each of the embodiments is described above as having certain features, any one or more of those features described with respect to any embodiment of the disclosure can be implemented in and/or combined with features of any of the other embodiments, even if that combination is not explicitly described. In other words, the described embodiments are not mutually exclusive, and permutations of one or more embodiments with one another remain within the scope of this disclosure.

Spatial and functional relationships between elements (for example, between modules, circuit elements, semiconductor layers, etc.) are described using various terms, including "connected," "engaged," "coupled," "adjacent," "next to," "on top of," "above," "below," and "disposed." Unless explicitly described as being "direct," when a relationship between first and second elements is described in the above disclosure, that relationship can be a direct relationship where no other intervening elements are present between the first and second elements, but can also be an indirect relationship where one or more intervening elements are present (either spatially or functionally) between the first and second elements. As used herein, the phrase at least one of A, B, and C should be construed to mean a logical (A OR B OR C), using a non-exclusive logical OR, and should not be construed to mean "at least one of A, at least one of B, and at least one of C."

In some implementations, a controller is part of a system, which may be part of the above-described examples. The controller may control various components or subparts of the system or systems. The controller, depending on the processing requirements and/or the type of system, may be programmed to control any of the processes disclosed herein.

Broadly speaking, the controller may be defined as electronics having various integrated circuits, logic, memory, and/or software that receive instructions, issue instructions, control operation, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller in the form of various individual settings (or program files), defining operational parameters for carrying out a particular process. The operational parameters may, in some embodiments, be part of a recipe defined by process engineers to accomplish one or more processing steps during the fabrication of one or more ingots described herein.

The controller, in some implementations, may be a part of or coupled to a computer that is integrated with the system, coupled to the system, otherwise networked to the system, or a combination thereof. For example, the controller may be in the "cloud" or all or a part of a fab host computer system, which can allow for remote access of the processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process.

In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the controller receives instructions in the form of data, which specify parameters for each of the processing steps to be performed during one or more operations. It should be understood that the parameters may be specific to the type of process to be performed and the type of tool that the controller is configured to interface with or control. Accordingly, as described above, the controller may be distributed, such as by comprising one or more discrete controllers that are networked together and working towards a common purpose, such as the processes and controls described herein.

As noted above, depending on the process step or steps to be performed by the tool, the controller might communicate with one or more of other tool circuits or modules, other tool components, cluster tools, other tool interfaces, adjacent tools, neighboring tools, tools located throughout a factory, a main computer, another controller in a semiconductor manufacturing factory.

The invention claimed is:

1. A crucible comprising:
   an outer element with a first portion that is horizontal at a bottom end of the crucible and a second portion that ascends radially outwardly from the bottom end of the crucible to a top end of the crucible at a first acute angle to a vertical axis; and
   an inner element including a conus with a cylinder at a base of the conus, the conus descending radially outwardly from the top end of the crucible to the bottom end of the crucible at a second acute angle to the vertical axis, a base portion of the cylinder attached to the first portion of the outer element using a sealant to form a hollow mold between an inner portion of the outer element and an outer portion of the inner element;
   wherein the hollow mold is configured to receive a solid material that is melted and cooled to form an ingot in the hollow mold; and
   wherein the inner element is configured to separate from the outer element when a force is applied to the inner element in a downward direction from the top end of the crucible after the ingot is formed in the hollow mold to release the ingot without cracking the ingot.

2. The crucible of claim 1 wherein the solid material comprises silicon, silicon carbide, or a non-oxide ceramic.

3. The crucible of claim 1 wherein the sealant comprises a mixture of silicon nitride and a liquid that is baked to form a seal between the outer element and the inner element.

4. The crucible of claim 1 further comprising a rod attached to a top end of the inner element to push the inner element downward from the top end of the crucible to disengage the inner element from the outer element after the ingot is formed in the hollow mold.

5. The crucible of claim 4 wherein the rod is made of graphite or molybdenum.

6. The crucible of claim 1 wherein:
   the inner element and the outer element are made of quartz; and
   the inner portion of the outer element and the outer portion of the inner element are coated with silicon nitride.

7. The crucible of claim 2 wherein the ingot is 600 mm long.

8. The crucible of claim 2 wherein the solid material includes a dopant.

9. The crucible of claim 1 further comprising:
   at least one heater arranged around the outer element to heat pieces of the solid material loaded in the hollow mold, wherein the solid material includes silicon, silicon carbide, or a non-oxide ceramic;
   a cooling apparatus arranged near the bottom end of the hollow mold to cool a melted liquid formed in the hollow mold by heating the pieces of the solid material; and
   at least one temperature sensor associated with the hollow mold to sense a temperature of contents of the hollow mold; and
   a controller to control the at least one heater and the cooling apparatus based on the sensed temperature to form the ingot from the melted liquid in the hollow mold.

* * * * *